United States Patent [19]

Kato et al.

[11] Patent Number: 4,804,929

[45] Date of Patent: Feb. 14, 1989

[54] CONTROL PULSE GENERATOR

[75] Inventors: Hideo Kato, Kawasaki; Hiroshi Iwahashi, Yokohama; Masamichi Asano, Tokyo; Akira Narita, Kawasaki; Shinichi Kikuchi, Yokohama, all of Japan

[73] Assignee: Kabushiki Kaisha Toshiba, Kawasaki, Japan

[21] Appl. No.: 101,667

[22] Filed: Sep. 28, 1987

[30] Foreign Application Priority Data

Oct. 9, 1986 [JP] Japan ............................ 61-240327

[51] Int. Cl.$^4$ ............................................ H03B 1/00
[52] U.S. Cl. .................................... 331/57; 331/108 B
[58] Field of Search ................. 331/57, 108 R, 108 A, 331/108 B, 108 C

[56] References Cited

U.S. PATENT DOCUMENTS 3,806,741 4/1974 Smith ................................ 331/57 X

FOREIGN PATENT DOCUMENTS 61-150515 7/1986 Japan .

Primary Examiner—Eugene R. LaRoche
Assistant Examiner—Robert J. Pascal
Attorney, Agent, or Firm—Finnegan, Henderson, Farabow, Garrett, & Dunner

[57] ABSTRACT

A control pulse generator according to the present invention includes a voltage generator for generating an output voltage proportional to a power supply voltage, an inverter for generating an inversion signal whose signal level is inverted when the output voltage from the voltage generator reaches a predetermined value, and a pulse signal generator for delaying a level inversion timing of the inversion signal by a predetermined delay time, and generating a control pulse having a width corresponding to the delay time. According to the control pulse generator with the above arrangement, the width of the control pulse can be determined on the basis of the delay time of the pulse signal generator, regardless of rise states of the power supply voltage. In addition, the height of the control pulse can be set at a desired value according to a supply voltage to the pulse signal generator, regardless of rise states of the supply voltage.

10 Claims, 8 Drawing Sheets

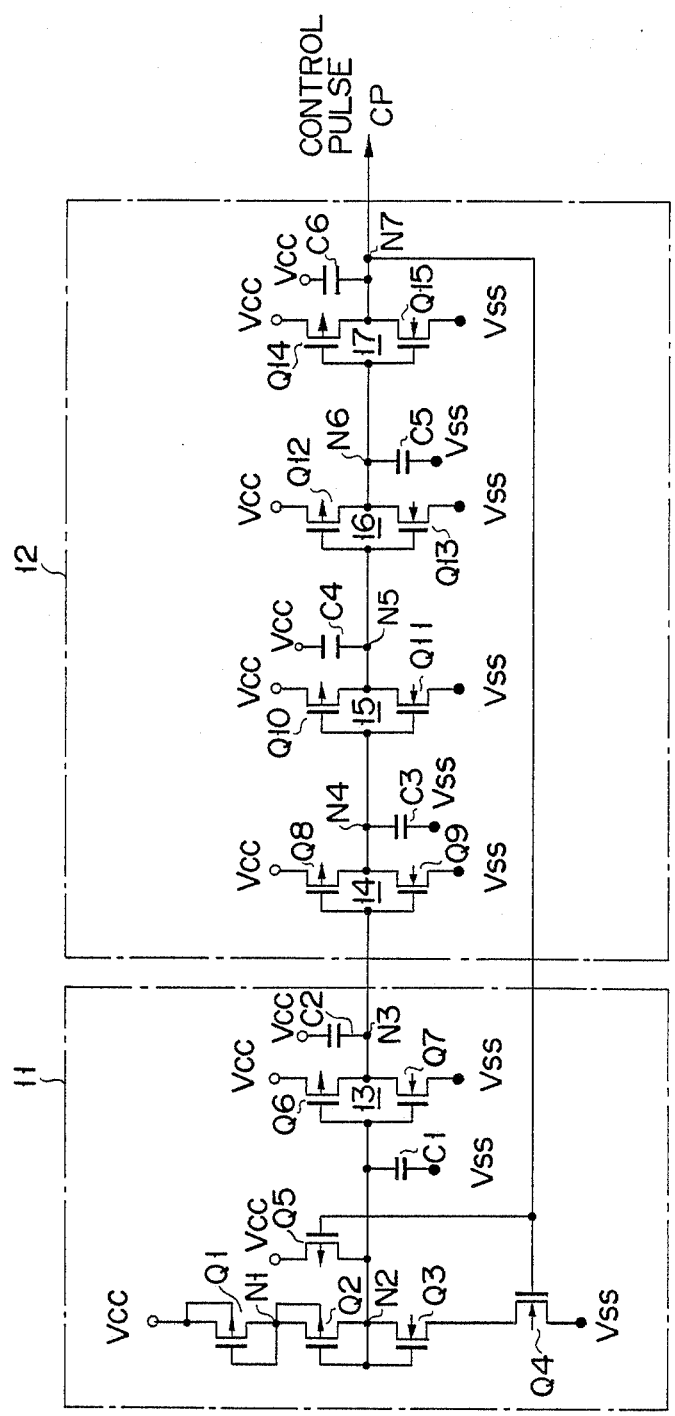
F I G. 1

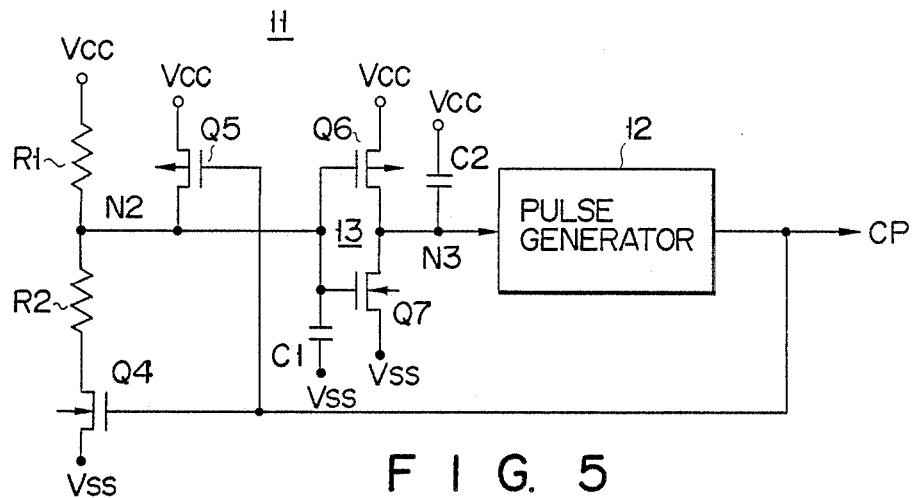
F I G. 5
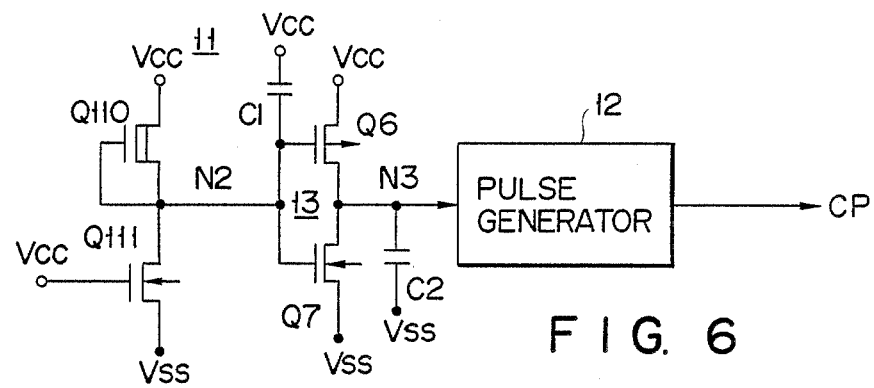
F I G. 6
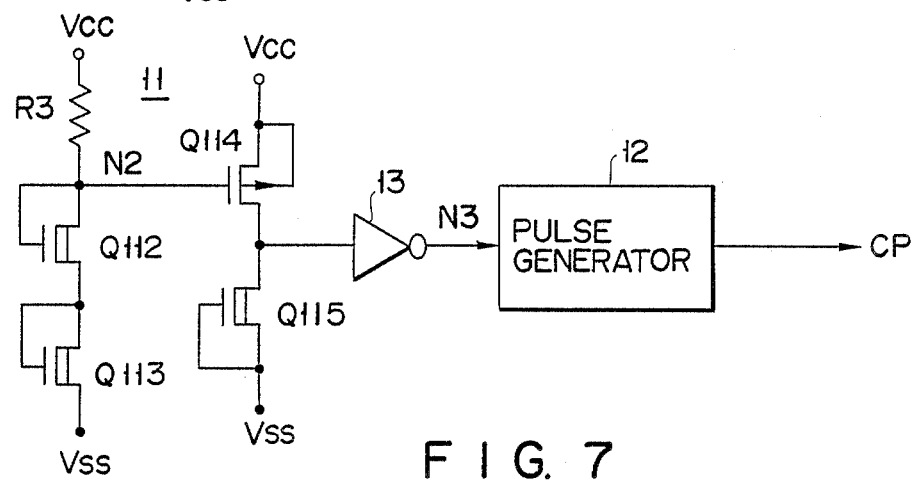
F I G. 7

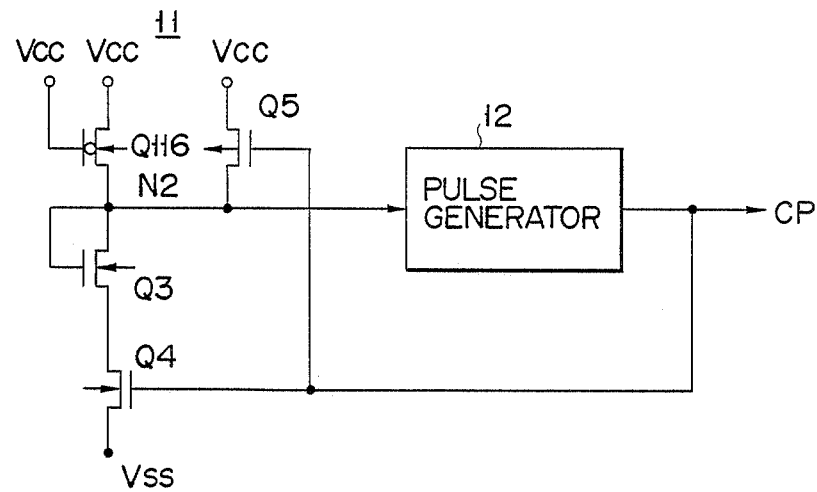
F I G. 8
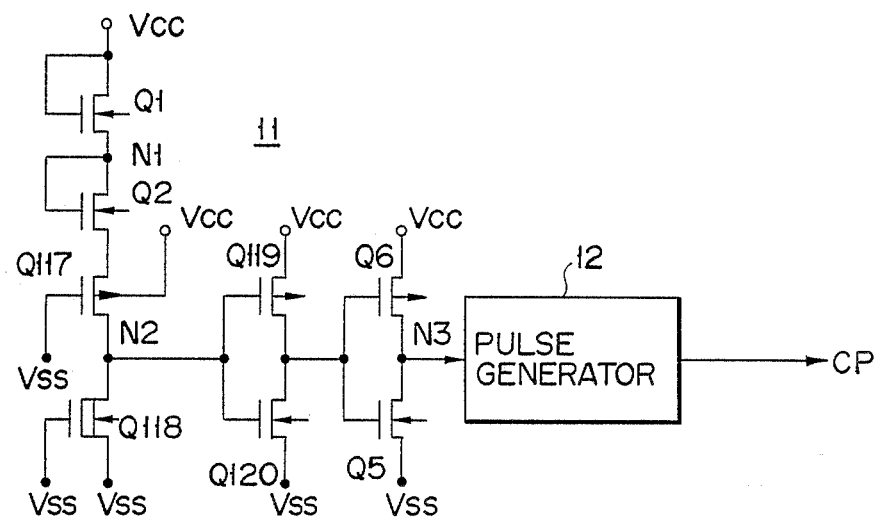
F I G. 9

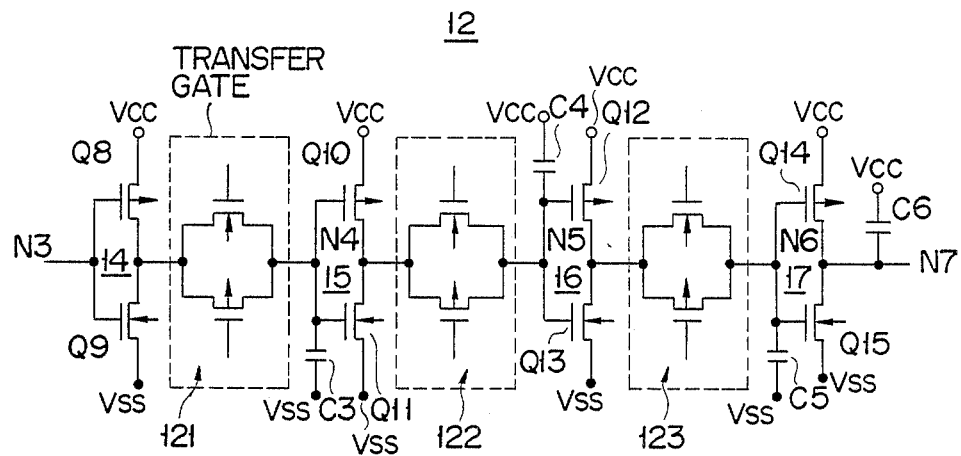
F I G. 10
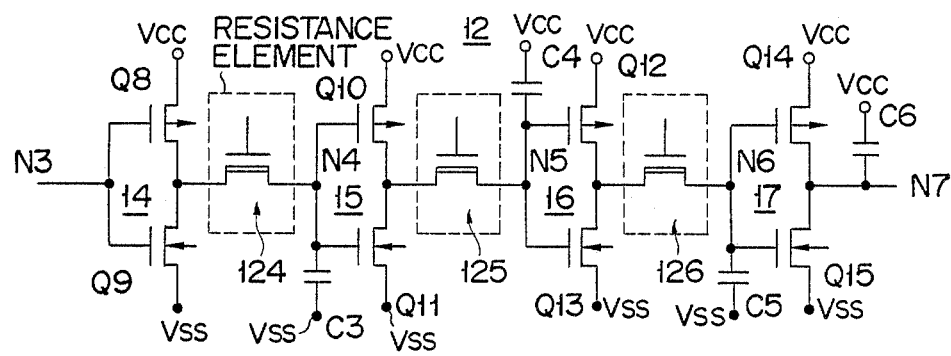
F I G. 11
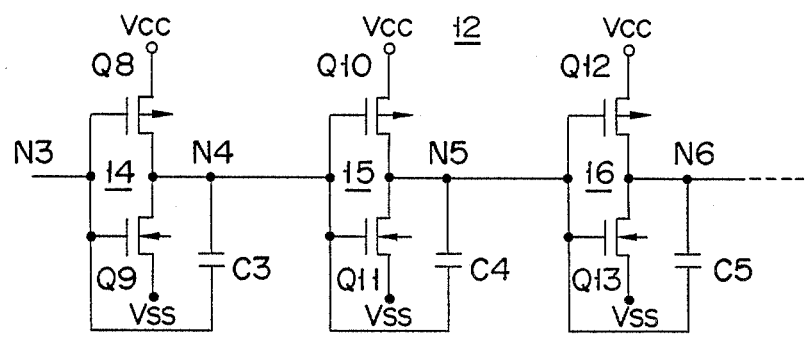
F I G. 12

CONTROL PULSE GENERATOR

BACKGROUND OF THE INVENTION

The present invention relates to a control pulse generator for initializing an internal circuit of a semiconductor integrated circuit (IC).

A control pulse generator, used for initialization, supplies an initializing pulse having a predetermined width to an IC internal circuit, such as a flip-flop, to be initialized upon energization (or power-on) of the IC circuit.

In an arrangement of a conventional control pulse generator, the width and height of an initializing pulse vary in accordance with the rise time of a power supply voltage upon energization of the control pulse generator. Therefore, when the rise time of the power supply voltage varies, the width and height of the initializing pulse vary considerably, thus posing a problem.

In general, the rise time of a power supply voltage of a semiconductor integrated circuit depends on a peripheral system coupled to the integrated circuit. Variations in the rise time of the power supply voltage, due to use of various peripheral systems, range from several nsec to several msec. Therefore, if the conventional control pulse generator is normally used, a control pulse having a sufficient width and height (voltage value) for initialization could not be supplied to an IC internal circuit, except for a specific system having a predetermined rise time of a power supply voltage well-matched to the conventional control pulse generator.

SUMMARY OF THE INVENTION

It is accordingly an object of the present invention to provide a control pulse generator capable of generating a control pulse for a required period of time, independently of the rise states of a power supply voltage.

To achieve the above object, a control pulse generator according to the present invention comprises: a voltage generator for generating an output voltage proportional to a power supply voltage; an inverter for generating an inversion signal which is level-inverted when the output voltage reaches a predetermined voltage value; and a pulse signal generator for delaying a level inversion timing of the inversion signal by a predetermined period of time and outputting a control pulse having a width corresponding to the delay time.

According to the control pulse generator with the above arrangement, the width of the control pulse can be determined by the delay time of the pulse signal generator, regardless of rise states of the power supply voltage. In addition, the height of the control pulse can be set at a desirable value according to the power supply voltage applied to the pulse signal generator, regardless of rise states of the power supply voltage.

BRIEF DESCRIPTION OF THE DRAWINGS

FIG. 1 is a circuit diagram showing a control pulse generator according to an embodiment of the present invention;

FIGS. 5 to 9 are circuit diagrams respectively showing modifications of the power supply voltage detector (11) in FIG. 1; and FIGS. 10 to 12 are circuit diagrams respectively showing modifications of the pulse generator (12) in FIG. 1.

DETAILED DESCRIPTION OF THE PREFERRED EMBODIMENT

An embodiment of the present invention will be described with reference to the accompanying drawings hereinafter. FIG. 1 shows a control pulse generator according to an embodiment of the present invention. The control pulse generator is formed of power supply voltage detector 11 and pulse generator 12.

In power supply voltage detector 11, P-channel MOS transistors Q1 and Q2, and N-channel MOS transistors Q3 and Q4 are inserted in series between power supply voltage terminal Vcc and ground terminal Vss.

Figure 4:
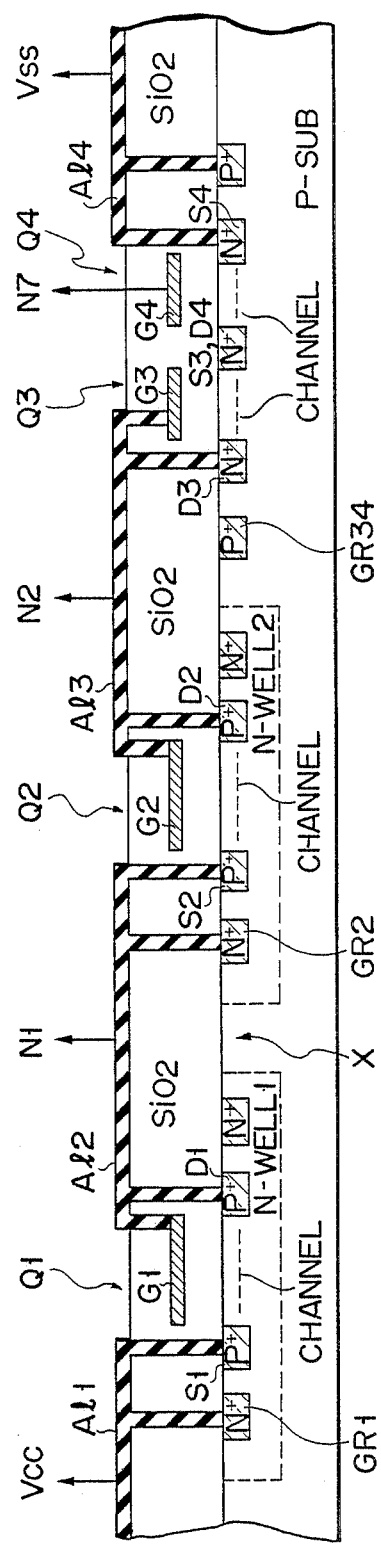
FIG. 4 is a sectional view showing a part of the structure of a power supply voltage detector (11) in a semiconductor substrate when the control pulse generator of FIG. 1 is formed into an IC.

When the control pulse generator is formed in an IC, source S1 of transistor Q1 and N-well 1 are connected to power supply voltage terminal Vcc through aluminum wiring Al1, as is shown in FIG. 4. Gate G1 and drain D1 of transistor Q1 are connected to source S2 of transistor Q2 and N-well 2, through aluminum wiring Al2 connected to node N1.

In the embodiment of FIG. 4, the N-wells of transistors Q1 and Q2 are connected to sources S1 and S2 through N+-guard rings GR1 and GR2 and aluminum wirings Al1 and Al2, respectively. These N-wells are isolated from each other by region X of a P-substrate. In this case, since one of transistors Q1 and Q2 (e.g., transistor Q1) serves as an independent constant current source with respect to the other transistor (e.g., transistor Q2), a variation in the threshold voltage of transistors Q1 and Q2, due to a substrate bias effect caused by a change in the power supply voltage (Vcc−Vss), becomes smaller than in a case wherein both wells of transistors Q1 and Q2 are formed on a common well of power supply voltage terminal Vcc.

Gate G2 and drain D2 of transistor Q2 are respectively connected to gate G3 and drain D3 of transistor Q3, through aluminum wiring Al3 connected to node N2. Transistors Q3 and Q4 hold source S3 and drain D4 in common. Source S4 of transistor Q4 and P+-guard ring GR34, which surrounds transistors Q3 and Q4, are connected to ground terminal Vss through aluminum wiring Al4.

With the above arrangement, a voltage, proportional to the power supply voltage (Vcc) or to the potential difference between terminals Vcc and Vss, is applied to node N2.

An output voltage (i.e., control pulse CP) from pulse generator 12 is applied to the gate of transistor Q4 in FIG. 1. The output voltage (CP=high level) is fed back to the gate of transistor Q4 immediately after a power switch of the control pulse generator is turned on. As a result, a change in the drain current of transistor Q4 in response to the change in the drain voltage thereof shows an unsaturation characteristic (so called a triode characteristic).

When the voltage at power supply voltage terminal Vcc is increased after the power switch is turned on, a current proportional to the square of the power supply voltage (Vcc-Vss) flows from terminal Vcc to terminal Vss. (A drain current of a MOS transistor operated in a saturated characteristic is proportional to the square of a voltage appearing across its gate-source path.) As a result, a potential proportional to the conductance ratio of transistors Q1 to Q3 as well as to the power supply voltage can be obtained at each of nodes N1 and N2.

The drain of P-channel transistor Q5 is connected to node N2. The source of transistor Q5 is connected to power supply voltage terminal Vcc, and control pulse CP output from pulse generator 12 is supplied to the gate of transistor Q5. Capacitor C1 is connected between node N2 and ground terminal Vss.

The input terminal of CMOS inverter 13 is connected to node N2. Inverter 13 is constituted by P-channel MOS transistor Q6, whose source is connected to power supply voltage terminal Vcc, and N-channel MOS transistor Q7, whose source is connected to ground terminal Vss. The input terminal of this inverter is constituted by the gates of transistors Q6 and Q7, and the output terminal thereof connected to node N3 is constituted by the drains of transistors Q6 and Q7. Node N3 is connected to supply voltage Vcc through capacitor C2.

Thus, in the above circuit arrangement, at the initial period of energization (power-on) of the control pulse generator, node N2 is set at the potential of ground terminal Vss through capacitor C1 in a discharged state, and node N3 is set at the potential of power supply voltage terminal Vcc through capacitor C2 in a discharged state.

After the power switch of the control pulse generator is turned on, the potential at node N2 rises as the power supply voltage (Vcc-Vss) increases. When the potential of node N2 exceeds a predetermined potential determined by an input threshold value of inverter 13, a potential level at output node N3 of inverter 13 is inverted from level "1" (high level) to level "0" (low level). A level inversion signal thus appearing at node N3 is supplied as a power supply voltage detection signal to pulse generator 12.

Pulse generator 12 is constituted by a plurality of cascade-connected (or series-connected) CMOS inverters and a plurality of capacitors respectively connected to output circuits of the inverters. In the embodiment shown in FIG. 1, the pulse generator is constituted by four inverters 14 to 17 and four capacitors C3 to C6.

More specifically, first CMOS inverter 14 is constituted by a series circuit of P- and N-channel MOS transistors Q8 and Q9 connected between power supply voltage terminal Vcc and ground terminal Vss. The gates of transistors Q8 and Q9 define the input terminal of inverter 14 for receiving the power supply voltage detection signal (from node N3). Output node N4 of inverter 14 is connected to ground terminal Vss through capacitor C3.

Second MOS inverter 15 is constituted by a series circuit of P- and N-channel MOS transistors Q10 and Q11 connected between power supply voltage terminal Vcc and ground terminal Vss. The gates of transistors Q10 and Q11 define the input terminal for receiving the output signal from first CMOS inverter 14 (node N4). Output node N5 of inverter 15 is connected to power supply voltage terminal Vcc through capacitor C4.

Third MS inverter 16 (transistors Q12 and Q13; capacitor C5; and output node N6) is constituted in the same manner as first CMOS inverter 14. Fourth CMOS inverter 17 (transistors Q14 and Q15; capacitor C6; and output node N7) is constituted in the same manner as second CMOS inverter 15.

Control pulse CP to be fed back to the gates of transistors Q4 and Q5 is output from node N7 of inverter 17. Control pulse CP is supplied as an initializing pulse to an IC internal circuit (not shown).

In the control pulse generator arrangement shown in FIG. 1, when a potential level at output node N3 of power supply voltage detector 11 is inverted from level "1" to level "0" by the increased power supply voltage (Vcc−Vss), a potential level at node N4 is inverted from level "0" to level "1" with a time lag caused by charging capacitor C3. Subsequently, in a time-serial and chain-reacting manner, a potential level at node N5 is inverted from level "1" to level "0" with a time lag caused by charging capacitor C4, a potential level at node N6 is inverted from level "1" to level "0" with a time lag caused by charging capacitor C5, and a potential level at node N7 is inverted from level "1" to level "0" with a time lag caused by charging capacitor C6.

A potential level at node N7 of the control pulse generator shown in FIG. 1 changes in the following manner. When the power switch of control pulse generator is turned on, the potential of node N7 is pulled up, via capacitor C6 connected to power supply voltage terminal Vcc, as the power supply voltage (Vcc−Vss) rises. As a result, the potential at node N7 changes from level "0" to level "1".

When the potential level at output node N3 of inverter 13 exceeds a predetermined value of the power supply voltage (Vcc-Vss) and is inverted from level "1" to level "0", this level change is delayed by a circuit time constant determined by capacitors C3 to C6 connected to nodes N4 to N7. After the delay time corresponding to the circuit time constant elapses, the potential level is inverted form level "1" to level "0".

More specifically, an inversion timing of the inversion signal from power supply voltage detector 11 (from node N3) is delayed by a predetermined period of time, and control pulse CP having a width corresponding to the delay time is output from pulse generator 12 (from node N7).

When the potential level at node N7 is inverted from level "1" to level "0", N-channel MOS transistor Q4 in power supply voltage detector 11 is turned off, and the series circuit of transistors Q1 to Q3 is disconnected from a path between terminals Vcc and Vss in a DC manner. At the same time, since P-channel transistor Q5 is turned on because of the level inversion at node N7 from level "1" to level "0", the potential level at node N2 abruptly rises to the power supply potential level (at Vcc). Then, the potential level at node N3 is reliably kept at level "0". Therefore, the control pulse generator operating states of inverters 14 to 17 are stabilized, and the generation of control pulse CP is assured.

In the above described manner, the control pulse generator shown in FIG. 1 can generate a control pulse which has a width corresponding to a predetermined time interval from the time when the power supply voltage reaches a predetermined value to the time when the potential level at node N7 is inverted, and which has a height substantially equal to the potential of the power supply voltage (Vcc−Vss) obtained at the time of this potential level inversion.

Figure 2A:
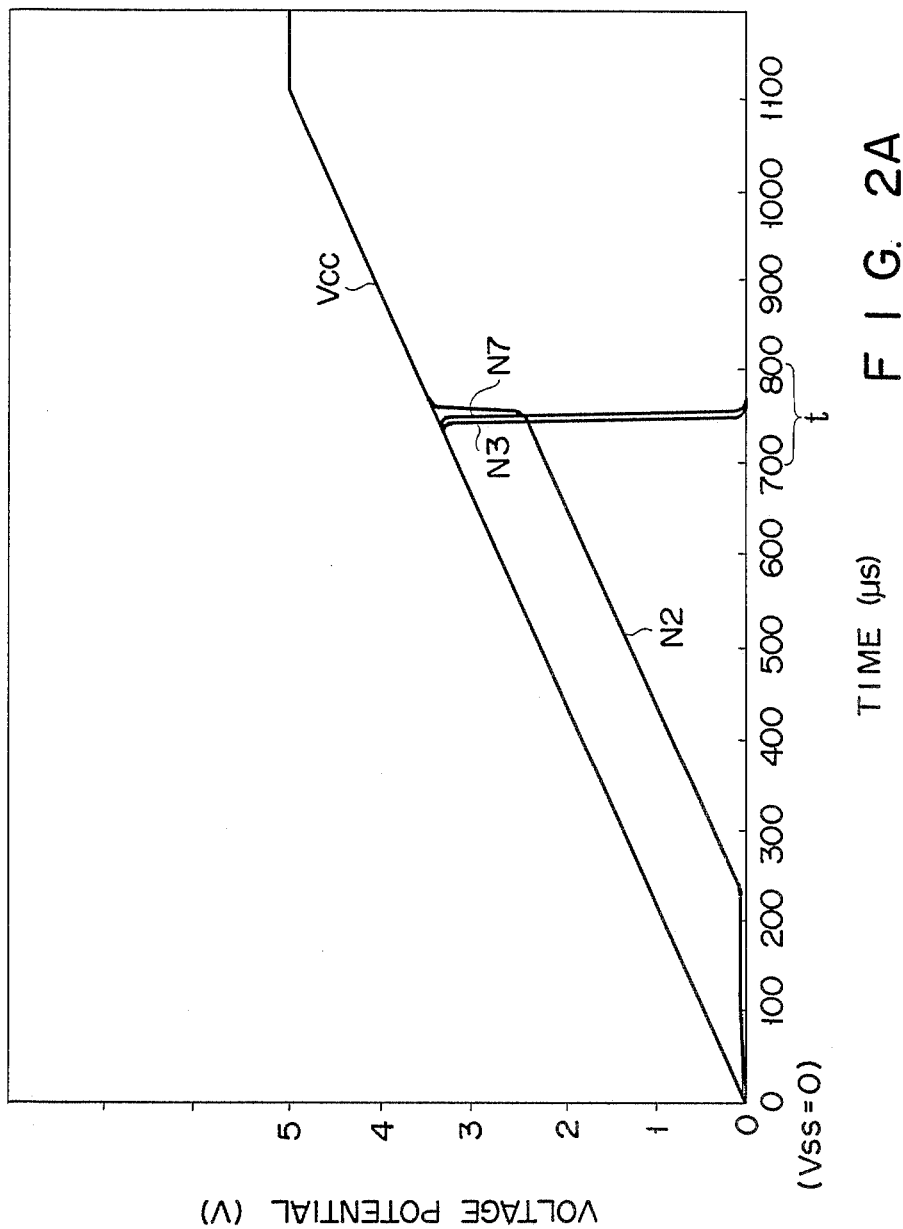
FIG. 2A is a graph showing a state of changes in potentials at nodes (N2, N3, and N7) in the generator of FIG. 1 when the rate of change in the power supply voltage (Vcc-Vss) with respect to time is relatively moderate.
Figure 2B:
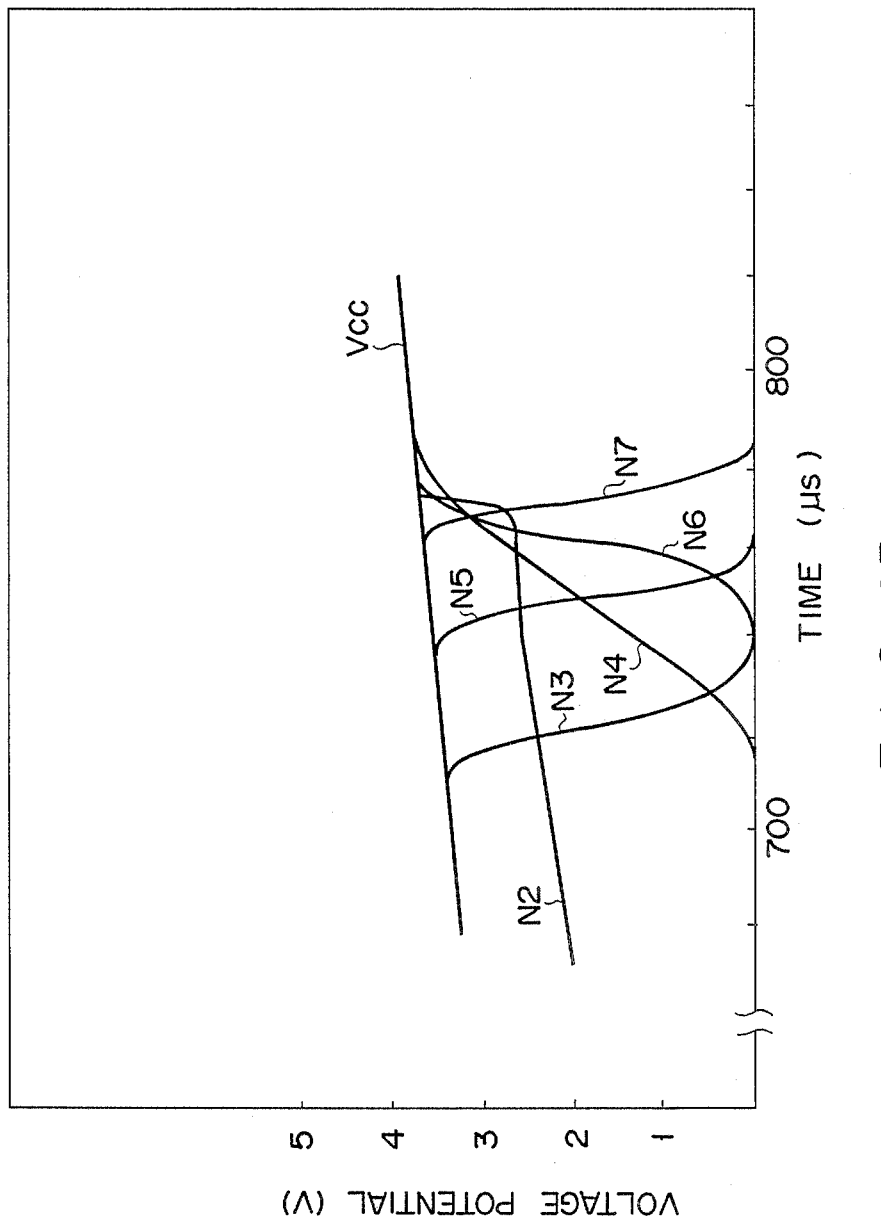
FIG. 2B is an enlarged graph showing a state of changes in potentials at the nodes (N2 to N7) of FIG. 1 for time interval t (700 to 800 μs) shown in FIG. 2A.

A potential change at each node in the control pulse generator shown in FIG. 1 is given, for example, as follows. FIG. 2A is a graph showing a state of changes in potentials at nodes N2, N3, and N7 when a rate of change in the power supply potential (Vcc) is relatively moderate. FIG. 2B is an enlarged graph showing a state of changes in potentials at nodes N2 to N7 for time interval t (700 to 800 μs) shown in FIG. 2A. On the other hand, FIG. 3 is a graph showing a state of changes in potentials at nodes N2 to N7 when the rate of change in the power supply potential (Vcc) is relatively steep.

When the rate of change in the power supply potential (Vcc) is moderate, the potential at node N7 also moderately rises, as is shown in FIG. 2A. When the power supply potential (Vcc) reaches a predetermined value and inverter 13 is inverted, the potential at node N3 changes to a low level as shown in FIG. 2B. After the potential level at node N3 changes, the potential at node N7 changes to a low level with a time delay (a predetermined period of time) caused by the actuation of inverters 14 and 17.

Figure 3:
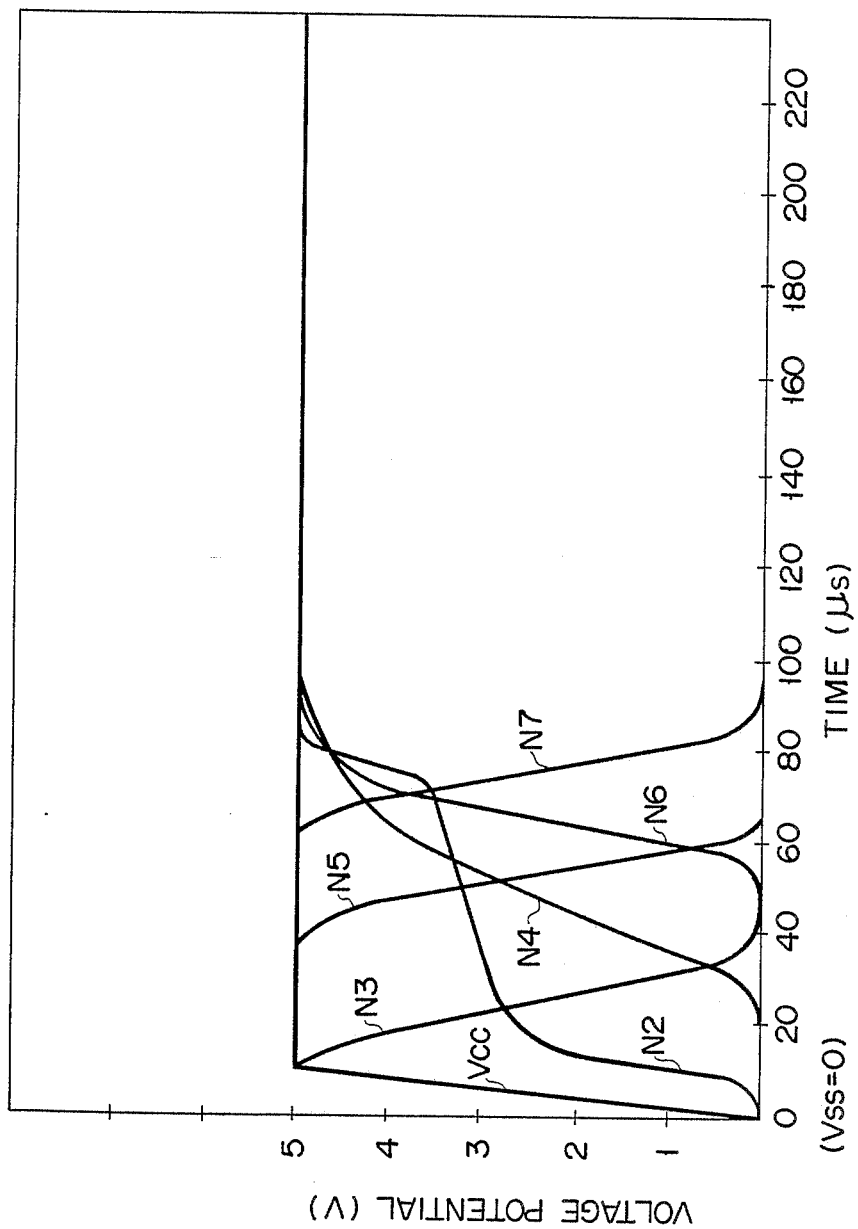
FIG. 3 is a graph showing a state of changes in potentials at the nodes (N2 to N7) in the generator of FIG. 1 when the rate of change in the power supply voltage (Vcc-Vss) is relatively steep.

When the rate of change in the power supply potential (Vcc) is steep, the potential at node N7 abruptly rises as is shown in FIG. 3. When the power supply potential (Vcc) reaches at the predetermined value and inverter 13 is inverted, the potential at node N3 changes to a low level as shown in FIG. 3. After the potential level at node N3 changes, the potential at node N7 changes to a low level with the time delay (the predetermined period of time) of inverters 14 to 17.

If the power supply voltage of the IC internal circuit (not shown) to be initialized is so set as to correspond to the potential at terminal Vcc of power supply voltage detector 11, and when the power supply voltage of the IC internal circuit at the time of the level change at node N3 is so set as to correspond to the start-up voltage of the internal circuit operation, control pulse CP required for initializing the internal circuit can be reliably obtained from node N7 for the predetermined period of time upon energization of the internal circuit. In this case, the period (the width of control pulse CP) between the level changes at node N3 and node N7 can be specified by the time delay (the predetermined period of time: about 50 μs in FIGS. 2B and 3) of inverters 14 to 17, independently of the rise states of the power supply potential.

FIGS. 5 to 9 are circuit diagrams respectively showing modifications of power supply voltage detector 11 in FIG. 1.

In FIG. 5, transistors Q1 and Q2 in FIG. 1 are replaced with diffusion resistor (or polysilicon resistor) R1, and transistor Q3 in FIG. 1 is replaced with diffusion resistor (or polysilicon resistor) R2. In this modification, pulse generator 12 is constituted by an even number of series-connected inverters (e.g., inverters 14 and 15, or 14 to 17 in FIG. 1). The operation of the circuit in FIG. 5 is substantially the same as that in FIG. 1.

In FIG. 6, a series circuit of depletion type load NMOS transistor Q110 and enhancement type NMOS transistor Q111 is used in place of the series circuit of transistors Q1 to Q4. A ratio for dividing the power supply voltage (Vcc-Vss), using the series circuit of transistors Q110 and 111, can be adjusted by changing a gate threshold voltage (Vth) of NMOS transistor Q111. A relationship between a level inversion point at node N3 and the power supply potential (Vcc) can be freely changed by the adjustment of the voltage dividing ratio. The operation of the circuit in FIG. 6 is substantially the same as that in FIG. 1 except that output pulse CP from pulse generator 12 is not fed back to node N2.

In FIG. 7, a series circuit constituted by diffusion resistor (or polysilicon resistor) R3 and depletion type NMOS transistors Q112 and Q113 is used in place of the series circuit constituted by transistors Q1 to Q4. The gate of PMOS transistor Q114 is connected to node N2 defined between resistor R3 and transistor Q112. The source and back gate of transistor Q114 are connected to power supply voltage terminal Vcc, and its drain is connected to ground terminal Vss through depletion type load NMOS transistor Q115. The drain of transistor Q114 is connected to the input terminal of inverter 13. Although another inverter (transistors Q114 and Q115) is inserted between inverter 13 and a voltage divider (resistor R3, and transistors Q112 and Q113) for dividing the power supply voltage, the operation of the circuit in FIG. 7 is substantially the same as that in FIG. 6.

In FIG. 8, transistors Q1 and Q2 are replaced with intrinsic type NMOS transistor Q116, and inverter 13 in FIG. 1 is omitted. In this case, pulse generator 12 is constituted by an odd number of series inverters (e.g., inverters 14 to 16 in FIG. 1). The operation of the circuit in FIG. 8 is substantially the same as that in FIG. 1.

In FIG. 9, enhancement type PMOS transistor Q117 is inserted between node N2 and the series circuit of transistors Q1 and Q2, and depletion type NMOS transistor Q118 is inserted between node N2 and ground terminal Vss. Another inverter (transistors Q119 and Q120) is also inserted between node N2 and the input terminal of inverter 13. The operation of the circuit in FIG. 9 is substantially the same as that in FIG. 7.

FIGS. 10 to 12 are circuit diagrams respectively showing modifications of pulse generator 12 in FIG. 1.

In FIG. 10, transfer gates 121, 122, and 123 are inserted between inverters 14 and 15, inverters 15 and 16, and inverters 16 and 17, respectively. A time required for charge-up of capacitors C3 to C6 can be freely changed by appropriately selecting switching timing for each of transfer gates 121, 122, and 123. Thus, the width of control pulse CP from node N7 can be arbitrarily set by adjusting the switching timing of transfer gates 121, 122, and 123. Incidentally, the pulse width of control pulse CP can be optionally modified by changing the conduction resistance of resistor elements formed by the P- and N-channel transistors in transfer gates 121, 122 and 123. In these transfer gates, each gate of the P-channel transistors is connected to ground terminal Vss while each gate of the N-channel transistors is connected to power supply voltage terminal Vcc, and the size of each of these transistors is properly selected to determine the conduction resistance thereof.

In FIG. 11, resistor elements 124, 125, and 126, using depletion type MOS transistors, are inserted between inverters 14 and 15, inverters 15 and 16, and inverters 16 and 17, respectively. A time required for charge-up of capacitors C3 to C6 can be freely changed by appropriately setting internal resistances of resistor elements 124, 125, and 126. Accordingly, the width of control pulse CP output from node N7 can be arbitrarily set by adjusting gate voltages of MOS transistors 124, 125, and 126. Incidentally, the pulse width of control pulse CP can also be modified by connecting each gate of depletion type MS transistors 124, 125 and 126 to power supply voltage terminal Vcc, and by properly selecting the size of each of these transistors.

In FIG. 12, capacitors C3, C4, and C5 are inserted between the input and output of inverter 14, the input and output of inverter 15, and the input and output of inverter 16, respectively. When the potential at node N3 changes from high level "H" to low level "L", the potential at output node N4 of inverter 14 changes from "L" level to "H" level. At this time, since capacitor C3 is inserted between nodes N3 and N4, the timing of level change at node N4 is delayed by a period required for charging capacitor C3. In this circuit configuration, capacitor C3 is connected between nodes N3 and N4, not between node N4 and ground terminal Vss as in the case of FIG. 1. Then, if the capacitance of capacitor C3 is fixed, the delay time obtained by the circuit of FIG. 12 can be made longer than that obtained by the circuit of FIG. 1.

In the following inverter (15, 16, . . .) of FIG. 12, the same circuit operation as that performed in inverter 14 is subsequently performed. Accordingly, by modifying any of or all of capacitances of capacitors C3, C4, C5, . . . , the pulse width of control pulse CP can be changed optionally.

Note that although in the embodiment shown in FIG. 1, the number of inverters in pulse generator 12 is four, the number can be optionally changed. The width of control pulse CP from node N7 can be arbitrarily set by adequately changing a capacitance of each of capacitors C1 to C6. The width of control pulse CP can be modified by changing gate threshold voltage (Vth) of each of MOS transistors Q8 to Q15 in pulse generator 12.

Furthermore, a possible minimum power supply voltage (or the level inversion point at node N3) for the IC to be initialized by the control pulse (from node N7) can be arbitrarily set by appropriately changing a gate length and/or width of each of transistors Q1 to Q3 in power supply voltage generator 11.

As has been described above, according to the present invention, an output pulse width of a control pulse for initializing an IC internal circuit, such as a flipflop, can be set independently of variations in the rise time of a power supply voltage. In other words, initialization of an IC internal circuit can be assured regardless of the rise states of a power supply voltage. Therefore, the versatility and possible applications of a semiconductor integrated circuit incorporating the control pulse generator of the present invention is greatly improved.

What is claimed is:

1. A control pulse generator for a semiconductor integrated circuit, comprising:
   voltage generating means for generating an output voltage proportional to a power supply voltage which is applied to the semiconductor integrated circuit;
   inverting means for generating an inversion signal, said inversion signal having an inverted level when the value of said output voltage reaches a predetermined voltage value; and
   pulse signal generating means for delaying the occurrence of said inversion signal by a predetermined delay time, for generating a control pulse having a width corresponding to said predetermined delay time, and for supplying said control pulse to an internal circuit of said semiconductor integrated circuit,
   wherein the voltage generating means includes voltage holding means for holding the value of the output voltage from said voltage generating means at a constant level in response to the signal level of said control pulse.

2. A generator according to claim 1, wherein said power supply voltage generating means includes:
   a plurality of MOS transistors of the same conductivity type respectively formed in well regions isolated from each other, source electrodes of said plurality of MS transistors being independently connected to said well regions, respectively.

3. A control pulse generator for a semiconductor integrated circuit according to claim 1, wherein said voltage generating means includes a plurality of MOS transistors of the same conductivity type formed in well regions isolated from each other, the source electrodes of said plurality of MS transistors being independently connected to said well regions.

4. A control pulse generator for a semiconductor circuit as in claim 1, wherein the initial power supply voltage of said internal circuit to be initialized by said control pulse corresponds to the power supply voltage level at which the inversion of said inversion signal occurs.

5. A generator according to claim 4, wherein said power supply voltage generating means includes:
   a plurality of MOS transistors of the same conductivity type respectively formed in well regions isolated from each other, source electrodes of said plurality of MOS transistors being independently connected to said well regions, respectively.

6. A control pulse generator for a semiconductor integrated circuit, comprising:
   voltage generating means for generating an output voltage proportional to a power supply voltage supplied to the semiconductor integrated circuit;
   inverting means for generating an inversion signal, said inversion signal having an inverted level when the value of said output voltage reaches a predetermined voltage value; and
   pulse signal generating means for delaying the occurrence of said inversion signal by a predetermined delay time, for generating a control pulse having a width corresponding to said predetermined delay time, and for supplying said control pulse to an internal circuit of a semiconductor integrated circuit, wherein
   said pulse generating means includes a plurality of cascade-connected CMOS inverters and a plurality of capacitors, respectively connected to the output terminals of said plurality of CMOS inverters, for setting the initial output potential of each of said CMOS inverters.

7. A generator according to claim 6, wherein one of said plurality of capacitors is connected between an output terminal of a first one of said plurality of CMOS inverters and a first power supply circuit of the semiconductor integrated circuit, and another capacitor of said plurality of capacitors is connected between an output terminal of a second one of said plurality of CMOS inverters and a second power supply circuit of the semiconductor integrated circuit, a difference in potential between said first power supply circuit and said second power supply circuit corresponding to said power supply voltage.

8. A generator according to claim 6, wherein said power supply voltage generating means includes:

a plurality of MOS transistors of the same conductivity type respectively formed in well regions isolated from each other, source electrodes of said plurality of MOS transistors being independently connected to said well regions, respectively.

9. A generator according to claim 6, wherein said power supply voltage generating means includes:
a plurality of MOS transistors of the same conductivity type respectively formed in well regions isolated from each other, source electrodes of said plurality of MOS transistors being independently connected to said well regions, respectively.

10. A control pulse generator for a semiconductor integrated circuit, comprising:
first generator means for generating an output voltage which is proportional to a power supply voltage applied to said semiconductor integrated circuit;
a capacitor, coupled to said first generator means, for setting an initial state of said output voltage;
second generator means, coupled to said first generator means, for generating an inversion signal, said inversion signal having an inverted output level when the value of said output voltage reaches a prescribed voltage level; and
circuit means coupled to said second generator means for delaying said inversion signal by a prescribed delay time, for generating a control pulse having a width corresponding to said prescribed delay time, and for supplying said control pulse to an internal circuit of the semiconductor integrated circuit.

* * * * *